US009251902B2

(12) United States Patent
Harada et al.

(10) Patent No.: US 9,251,902 B2
(45) Date of Patent: Feb. 2, 2016

(54) SEMICONDUCTOR STORAGE DEVICE

(71) Applicant: KABUSHIKI KAISHA TOSHIBA, Minato-ku (JP)

(72) Inventors: Yoshikazu Harada, Kawasaki (JP); Masahiro Yoshihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/202,361

(22) Filed: Mar. 10, 2014

(65) Prior Publication Data

US 2015/0071006 A1  Mar. 12, 2015

Related U.S. Application Data

(60) Provisional application No. 61/875,484, filed on Sep. 9, 2013.

(51) Int. Cl.
*G11C 16/34* (2006.01)
*G11C 16/10* (2006.01)
*G11C 16/26* (2006.01)
*G11C 16/14* (2006.01)
*G11C 16/04* (2006.01)
*G11C 11/56* (2006.01)

(52) U.S. Cl.
CPC ............ *G11C 16/10* (2013.01); *G11C 11/5628* (2013.01); *G11C 16/0483* (2013.01); *G11C 16/3436* (2013.01); *G11C 16/3459* (2013.01); *G11C 16/3445* (2013.01); *G11C 16/3454* (2013.01)

(58) Field of Classification Search
CPC .......... G11C 16/3459; G11C 16/0483; G11C 16/10; G11C 11/5628; G11C 16/3445; G11C 16/3454
USPC .............. 365/185.22, 185.17, 185.01, 185.18
See application file for complete search history.

(56) References Cited

U.S. PATENT DOCUMENTS

| 2001/0005328 A1* | 6/2001 | Tsunesada ............... 365/185.03 |
| 2008/0298133 A1* | 12/2008 | Kim et al. ................ 365/185.22 |
| 2010/0131811 A1* | 5/2010 | Eto .............................. 714/721 |
| 2010/0284227 A1* | 11/2010 | Choi et al. ............... 365/185.22 |
| 2012/0245907 A1* | 9/2012 | Yagyuu ............................ 703/2 |
| 2014/0233299 A1* | 8/2014 | Lan et al. ...................... 365/148 |

* cited by examiner

*Primary Examiner* — Ly D Pham
(74) *Attorney, Agent, or Firm* — Oblon, McClelland, Maier & Neustadt, L.L.P.

(57) ABSTRACT

The semiconductor storage device of the embodiment includes memory cells. Word lines are connected to the memory cells. Bit lines are connected to the memory cells. A sense amplifier unit is connected to the bit lines. A data write operation includes a first write loop and a second write loop. The first write loop includes a first program operation and a first verify operation. The second write loop includes a second program operation and a second verify operation. A maximum value of a consumed current in the first verify operation is substantially equal to a maximum value of the consumed current in the second verify operation. The consumed current in the first verify operation is substantially same as the consumed current in the second verify operation if data input in the data write operation is all equal to first data corresponding to an erasure state.

8 Claims, 9 Drawing Sheets

READ

VERIFY

|  | E | A(WRITING) | A(PASS) |
|---|---|---|---|
| Din Data | 1 | 0 | 0 |
| Program Data | 1 | 0 | 1 |

FIG. 6

SEMICONDUCTOR STORAGE DEVICE

CROSS REFERENCE TO RELATED APPLICATIONS

This application is based upon and claims the benefit of priority from the prior U.S. Provisional Patent Application No. 61/875,484, filed on Sep. 9, 2013, the entire contents of which are incorporated herein by reference.

FIELD

The embodiments of the present invention relate to a semiconductor storage device.

BACKGROUND

Semiconductor storage devices such as a NAND flash memory are widely known.

BRIEF DESCRIPTION OF THE DRAWINGS

FIG. 6 is a data table showing whether it is necessary or unnecessary to write data;

DETAILED DESCRIPTION

Embodiments will now be explained with reference to the accompanying drawings. The present invention is not limited to the embodiments.

The semiconductor storage device according to the present embodiment includes a plurality of memory cells. A plurality of word lines are connected to the memory cells. A plurality of bit lines are connected to the memory cells. A sense amplifier unit is connected to the bit lines. A data write operation includes a first write loop and a second write loop. The first write loop includes a first program operation and a first verify operation. The second write loop includes a second program operation and a second verify operation. A maximum value of a consumed current in the first verify operation is substantially equal to a maximum value of the consumed current in the second verify operation. The consumed current in the first verify operation is substantially same as the consumed current in the second verify operation if data input in the data write operation is all equal to first data corresponding to an erasure state.

Components with substantially the same functionalities and configurations will be referred to with the same reference number and duplicate descriptions will be made only when required. Note that figures are schematic and the relationship between the thickness and the plane dimension of a film and the ratios of the thickness of one layer to another may differ from actual values. Therefore, it should be noted that a specific thickness and dimension should be determined in accordance with the following description. Moreover, it is natural that different figures may contain a component different in dimension and/or ratio.

In the following description, "connect to an element" means "connect to an element via another element" as well as "connect to an element directly."

First Embodiment

Figure 1:
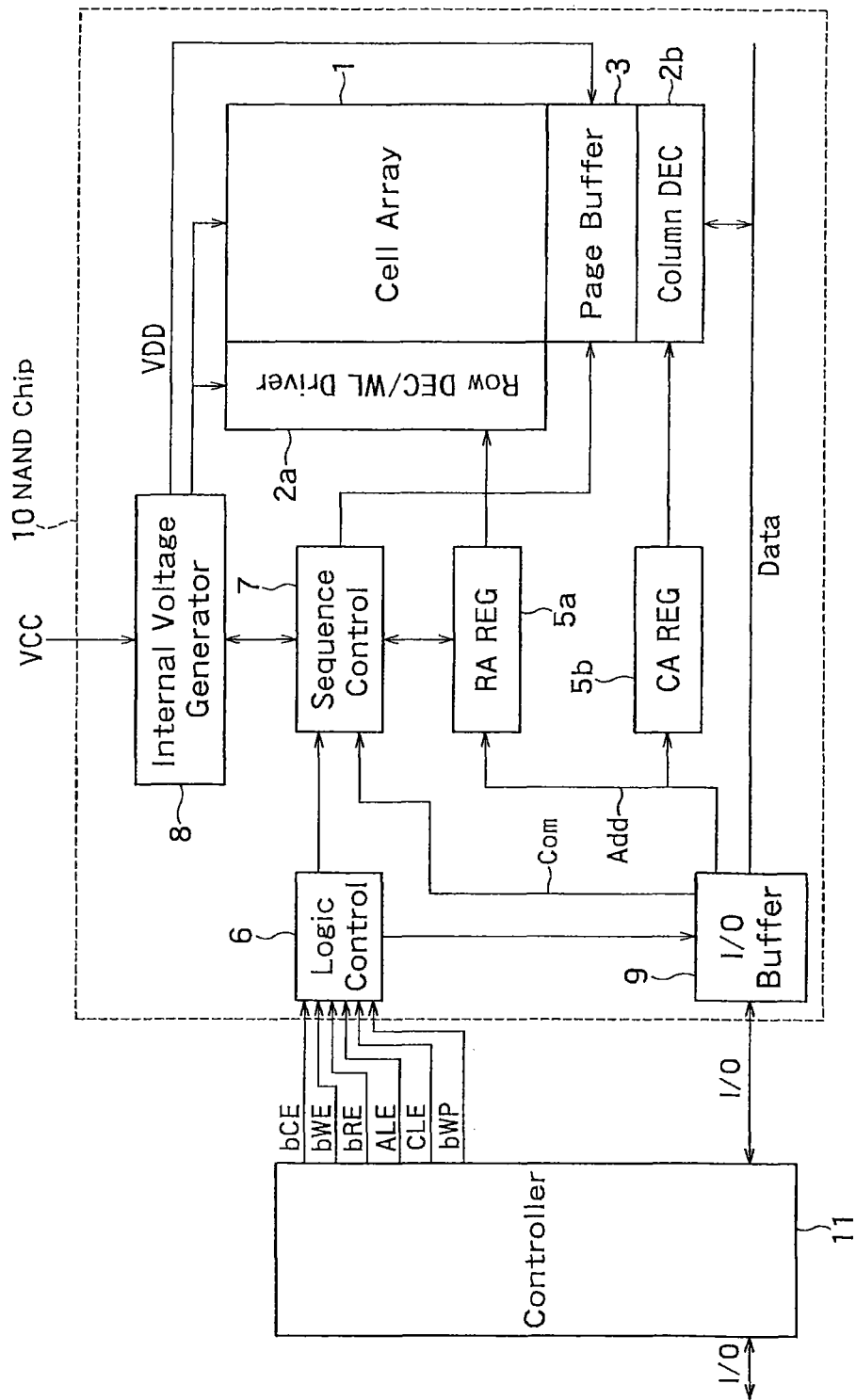
FIG. 1 is a block diagram showing an example of a configuration of a NAND flash memory according to a first embodiment.

FIG. 1 is a block diagram showing an example of a configuration of a NAND flash memory (hereinafter, also simply "memory") according to a first embodiment. The NAND flash memory according to the present embodiment includes a NAND chip 10 and a controller 11 controlling the NAND chip 10. The NAND chip 10 and the controller 11 can be resin-sealed into one package as a multichip package (MCP).

A memory cell array 1 constituting the NAND chip 10 is configured by two-dimensionally arranging a plurality of memory cells MC in a matrix. Each of these memory cells MC includes a charge accumulation layer. The memory cell MC is not limited to an FG memory cell. For example, a MONOS memory cell can be used as the memory cell MC. A row decoder/word line driver 2a, a column decoder 2b, a page buffer 3, and an internal voltage generator 8 constitute a data write/read circuit that writes or reads data to or from every page of the memory cell array 1. The row decoder/word line driver 2a selectively drives word lines WL (see FIG. 2) in the memory cell array 1. The page buffer 3 includes a sense amplifier circuit and a data holding circuit corresponding to one page and reads or writes data from or to each of the pages of the memory cell array 1.

Columns of the read data on one page read by the page buffer 3 are sequentially selected by the column decoder 2b and the selected data is output to an external I/O terminal via an I/O buffer 9. Columns of the write data supplied from the I/O terminal are sequentially selected by the column decoder 2b and the selected data is loaded to the page buffer 3. The write data on one page is loaded to the page buffer 3. A row address signal and a column address signal are input via the I/O buffer 9 and transferred to the row decoder 2a and the column decoder 2b, respectively. A row address register 5a holds an erasure-target block address in an erasure operation, and holds a page address in a write or read operation (hereinafter, also "data write or data read operation"). An initial column address used to load the write data before start of the write operation or that for the read operation is input to a column address register 5b. The column address register 5b holds the input column address until a write enable signal bWE or a read enable signal bRE is toggled under predetermined conditions.

A logic control circuit 6 controls input of a command or address and controls input/output of data based on a control signal such as a chip enable signal bCE, a command enable signal CLE, an address latch enable signal ALE, the write enable signal bWE, or the read enable signal bRE. The read operation or the write operation is performed in response to the command. A sequence control circuit 7 receives the command and controls a read sequence, a write sequence, or an erasure sequence. The internal voltage generator 8 receives an external power supply voltage VCC and generates predetermined voltages necessary for various operations under the control of the sequence control circuit 7. The internal voltage generator 8 generates an internal power supply voltage VDC for sense amplifiers SA to be described later.

The controller 11 executes a data write control and a data read control under conditions appropriate for a present write state of the NAND chip 10. Needless to mention, the NAND chip 10 can undertake a part of the data read control.

Figure 2:
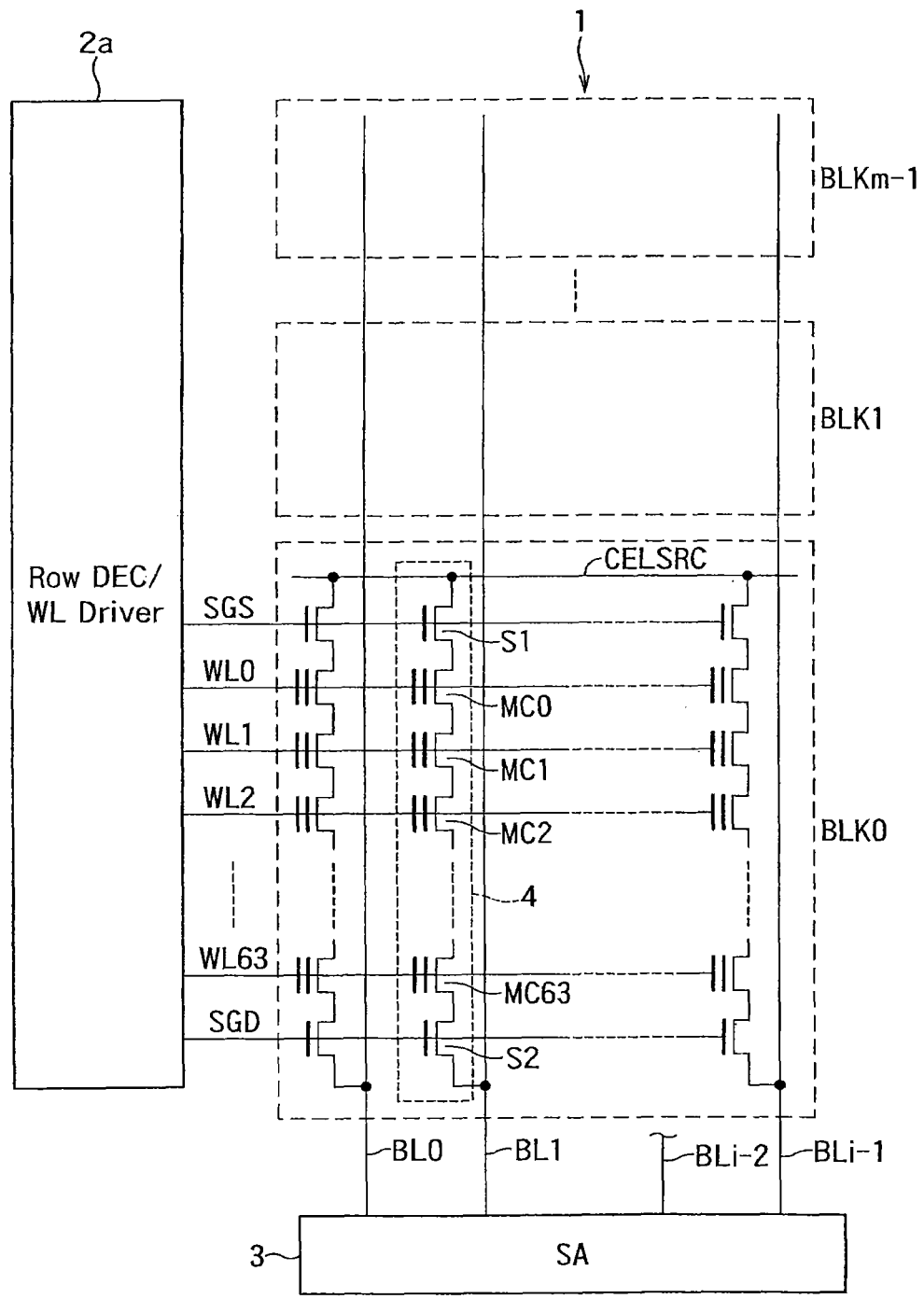
FIG. 2 shows an example of a specific configuration of the memory cell array 1.

FIG. 2 shows an example of a specific configuration of the memory cell array 1. In this example, 64 memory cells MC0 to MC63 connected in series and selection gate transistors S1 and S2 connected to both ends of the series-connected memory cells MC0 to MC63, respectively, constitute one NAND cell unit (a NAND string) 4. A source of the selection gate transistor S1 is connected to a common source line CELSRC and a drain of the selection gate transistor S2 is connected to one bit line BL (one of bit lines BL0 to BLi−1). That is, the bit line BL is connected to one end of a current path for the memory cells MC. Control gates of the memory cells MC0 to MC63 are connected to word lines WL (WL0 to WL63), respectively, and gates of the selection gate transistors S1 and S2 are connected to selection gate lines SGS and SGD, respectively.

A range of a plurality of memory cells MC along one word line WL constitutes one page (a page unit) from and to which data is read and written at one time. A range of a plurality of NAND cell units 4 arranged in a direction of the word lines WL constitutes one cell block BLK (hereinafter, also simply "block BLK") that is an erasure unit from which data is erased at one time. In FIG. 2, a plurality of cell blocks BLK0 to BLKm−1 sharing the bit lines BL are arranged in a direction of the bit lines BL to constitute the memory cell array 1. The word lines WL and the selection gate lines SGS and SGD are driven by the row decoder 2a. The bit lines BL are connected to the sense amplifiers SA included in the page buffer 3 shown in FIG. 1, respectively. The sense amplifiers SA detect data stored in the memory cells MC selected by one bit line BL and one word line WL, respectively.

Figure 3:
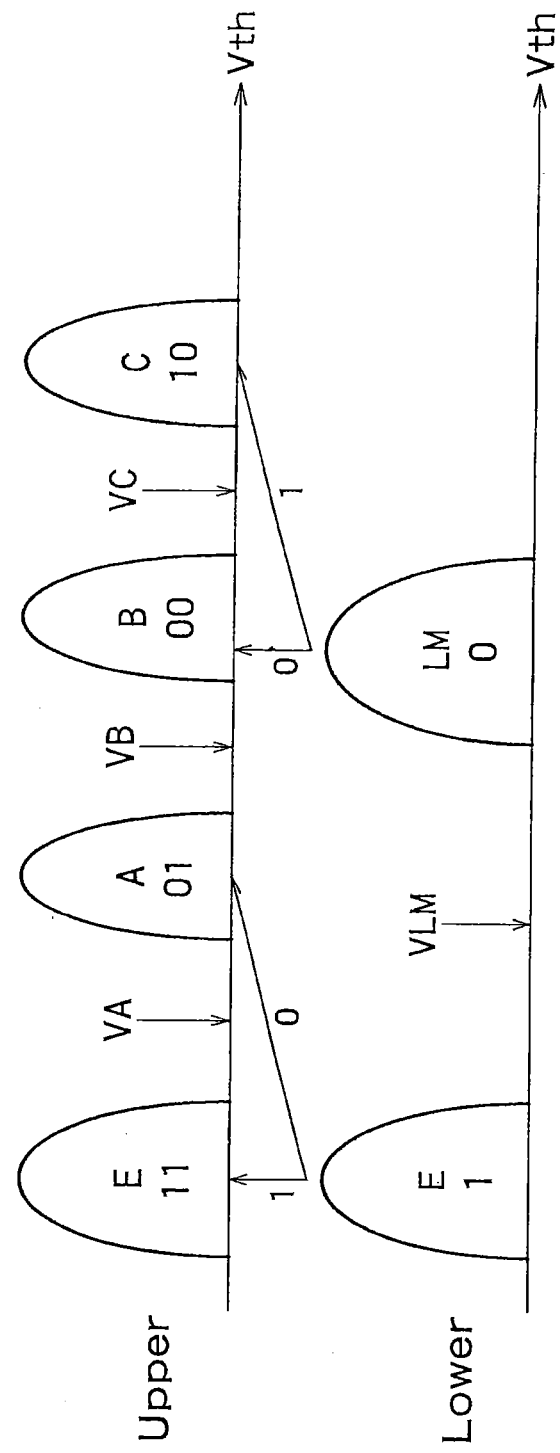
FIG. 3 shows threshold distributions of the memory cells MC at the time of writing two-bit data.

FIG. 3 shows threshold distributions of the memory cells MC at the time of writing two-bit data. In the memory according to the present embodiment, two-bit data is stored in one memory cell MC. Threshold voltages Vt of all the memory cells MC in one block BLK change to a lowest "E (erasure)" level by block erasure. Thereafter, at the time of writing data to the memory cells MC on a lower page, the data is written to the memory cells MC storing data "0" on the lower page so as to raise the threshold voltages Vt from the "E" level to an "LM" level. The "E" level and the "LM" level then vary under the influence of adjacent memory cells MC to which data is written, thereby increasing the threshold distribution widths. At the time of writing data to the memory cells MC on an upper page, the threshold distributions are further shifted according to the upper page data, thereby generating four narrow threshold distributions "E", "A", "B", and "C" corresponding to data "11", "01", "00", and "10", respectively. In this case, the lowest E (erasure) level is used as it is without being shifted. The second lowest A level is generated by shifting from the E level. The B and C levels are generated by shifting from the LM level.

In the NAND flash memory, data is written to the memory cells MC by repeating a write loop formed of a program operation for writing data to selected ones of the memory cells MC and a verify operation for verifying whether the data is written to the selected memory cells MC a plurality of times. For example, writing of data to the memory cells MC on the lower page (writing at the threshold voltage Vt from the E level to the LM level) and writing of data to the memory cells MC on the upper page (writing at the threshold voltage Vt from the E level to the A level and writing at the threshold voltage Vt from the LM level to the B and C levels) shown in FIG. 3 is realized by executing a write sequence including a plurality of write loops.

In the verify operation in each write loop, at the time of detecting the data corresponding to the E and LM levels on the lower page, it suffices to set a voltage of the word line WL to VLM. The sense amplifiers SA can thereby detect the data on the lower page.

At the time of detecting the data corresponding to the E, A, B, and C levels on the upper page, the voltage of the word line WL is stepped up to VA, VB, and VC in this order. When the voltage of the word line WL is VA, the memory cells MC at the E level (hereinafter, also "E-level cells") are discriminated from the other memory cells MC at the A to C levels (hereinafter, also "A-level, B-level, and C-level cells"). The E-level cells are thereby confirmed. Next, when the voltage of the word line WL is VB, the A-level cells are discriminated from the other B-level and C-level cells. The A-level cells are thereby confirmed. When the voltage of the word line WL is VC, the B-level cells are discriminated from the C-level cells. The B-level cells and the C-level cells are thereby confirmed. In this way, the sense amplifiers SA can detect the data corresponding to the E, A, B, and C levels and written to the memory cells MC on the upper page by changing the voltage of the word line WL to VA, VB, and VC.

(Data Write)

FIGS. 4A to 4E show threshold distributions of the memory cells MC at respective stages of the write sequence for writing data from the E level to the LM level (on a LOWER page), respectively. A verify level is VLM. Writing of data from the E level to the A level (on one part of an UPPER page) and writing of data from the LM level to the B or C level (on the other part of the UPPER page) are not described because these write sequences can be easily executed by referring to FIGS. 4A to 4E and changing the verify level.

Figure 4A:
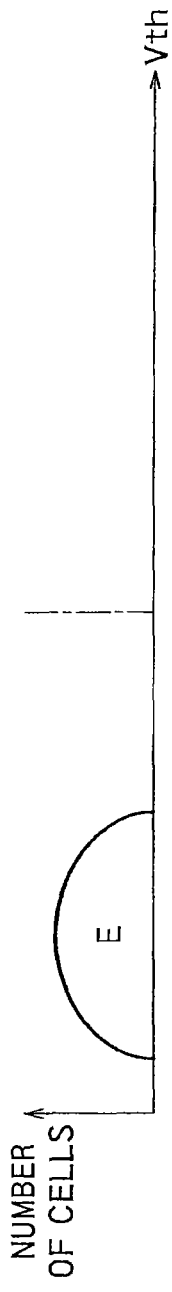
FIGS. 4A to 4E show threshold distributions of the memory cells MC at respective stages of the write sequence for writing data from the E level to the LM level, respectively.

First, at the beginning of the write sequence, it is assumed that a plurality of memory cells MC are at the E level (in an erasure state) as shown in FIG. 4A. At this time, the memory cells MC in all write target columns are in an ON-state when the verify operation starts and the sense amplifiers SA apply a cell current Icell to the memory cells MC.

Figure 4B:
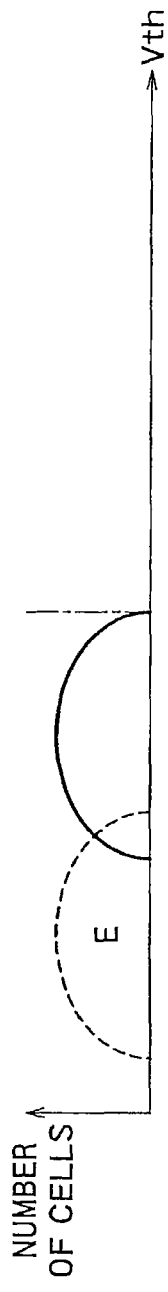
Figure 4C:
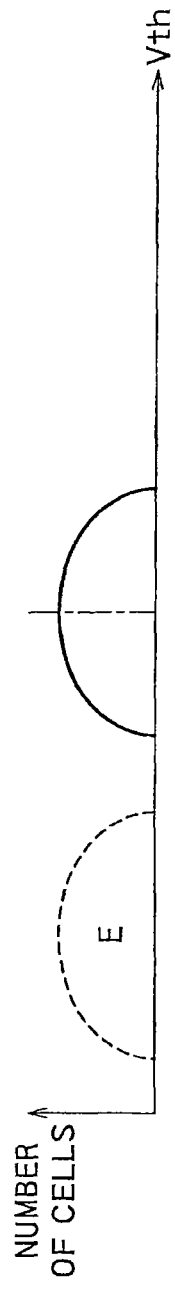
Figure 4D:
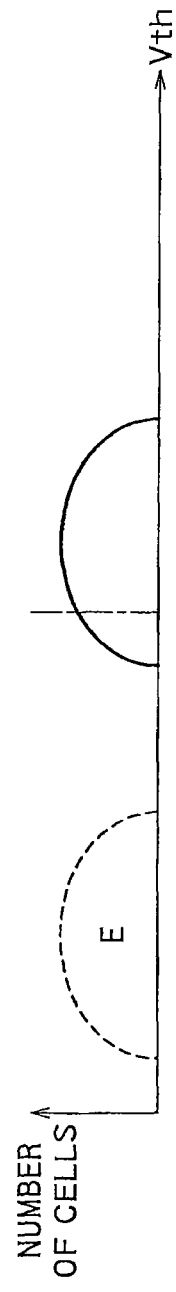

Thereafter, the write loops are repeatedly executed, whereby the threshold distribution of the memory cells MC is gradually shifted toward the LM level as shown in FIGS. 4B to 4D. In FIG. 4C, about half the memory cells MC exceed the verify level VLM. That is, about half the memory cells MC are in an OFF-state in the verify operation. In FIG. 4D, most of the memory cells MC exceed the verify level VLM. That is, most of the memory cell MC are in the OFF-state in the verify operation.

Figure 4E:
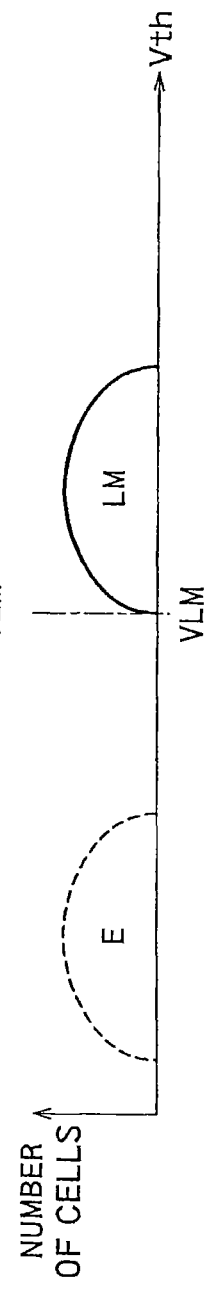

In FIG. 4E, when all the memory cells MC exceed the verify level VLM, all the memory cells MC are in the OFF-state in the verify operation.

In this way, at the beginning of the write sequence, all the memory cells MC are at the E level, so that the total cell current Icell in the verify operation is quite high. When the write loops are repeated in the write sequence and the threshold distribution of some of the memory cells MC is shifted to a higher-voltage side, the total cell current Icell in the verify operation gradually lowers. When the memory cells MC in all the write target columns exceed the verify level VLM, the total cell current Icell in the verify operation becomes quite low. That is, although being quite high at an initial stage of the write sequence, the total cell current Icell becomes quite low at a final stage of the write sequence.

However, according to the ABL architecture, all the memory cells MC connected to one word line WL are accessed at one time, which still requires the bit lines BL in all the write target columns to be charged. In this case, even if the memory cells MC exceed the verify level VLM, a current for charging the bit lines BL is necessary. Accordingly, a consumed current in the verify operation remains high. There is known a precharge select function (hereinafter, "PCHSEL function") so as to reduce the consumed current in the verify operation. The PCHSEL function is a function to lock out the bit lines BL corresponding to unnecessary-to-write (write-protected) memory cells MC and data-written memory cells MC without charging the bit lines BL, and to selectively charge the bit lines BL corresponding to necessary-to-write memory cells MC. Use of the PCHSEL function enables a reduction in the consumed current in the verify operation.

(Data Read)

On the other hand, in the data read operation, a two-strobe method is used to detect data. A strobe is a signal (a strobe signal) that determines a timing at which the sense amplifiers SA detect (latch) the data transmitted to sense nodes. The two-strobe method is a method of activating the strobe signal twice per data read operation. For example, in a case of discriminating the E-level cells from the A-level to C-level cells (in a case of reading the data on the UPPER page), the sense amplifiers SA detect the E-level cells using the reference voltage VA during a first strobe period according to the two-strobe method, and lock out the bit lines BL corresponding to the E-level cells. To lock out the bit lines BL is an operation for fixing a voltage of the bit line BL to a reference voltage Vss (a voltage of the cell source line CELSRC or a ground voltage) at the time of data detection. During the first strobe period, the voltage of the cell source line CELSRC possibly floats.

Accordingly, the bit lines BL in the columns for which it is ensured that the memory cells MC are the E-level cells are detected on the premise of certain erroneous detection. By locking out the bit lines BL in the columns in which the memory cells MC are confirmed as the E-level cells, the sense amplifiers SA can accurately detect the data during a second strobe period in a state where the voltage of the cell source line CELSRC is kept stable. During the second strobe period, the sense amplifiers SA discriminate the E-level cells from the A-level to C-level cells using the reference voltage VA again. The sense amplifiers SA can thereby accurately discriminate the E-level cells from the A-level to C-level cells.

If the sense amplifiers SA are to detect the data stored in the E-level cells and the A-level cells (hereinafter, also "E-level data" and "A-level data") during one strobe period, the voltage of the cell source line CELSRC rises (floats) because the cell current Icell applied to the E-level cells having a low threshold voltage is high. When the voltage of the cell source line CELSRC floats, the sense amplifiers SA possibly erroneously detect data. To avoid the problem, the voltage of the cell source line CELSRC is suppressed from floating during the second strobe period by locking out the bit lines BL corresponding to the E-level cells detected during the first strobe period. The sense amplifiers SA can thereby accurately detect the E-level data and the A-level to C-level data.

(Read Noise)

In the data read operation, the bit lines BL corresponding to the E-level cells are locked out during the second strobe period. On the other hand, in a case of the PCHSEL function used in the data write operation, the bit lines BL corresponding to the unnecessary-to-write memory cells MC and the data-written memory cells MC are locked out. That is, in the verify operation, not only the bit lines BL corresponding to the E-level cells but also the bit lines BL corresponding to the data-written memory cells MC are locked out. In this case, the columns of the bit lines BL locked out in the verify operation in a final write loop in a certain write sequence may greatly differ from those of the bit lines BL locked out in the read operation. For example, in a case of writing the A-level data to the memory cells MC storing therein the E-level data in all the columns, in the verify operation in the final write loop, the memory cells MC in many columns already pass a verification in the previous write loops. Therefore, in the verify operation in the final write loop, the bit lines BL in the many columns are locked out. In contrast, in the data read operation, the bit lines BL corresponding to the E-level cells are locked out while the bit lines BL corresponding to the other cells, that is, the A-level to C-level cells are not locked out during the second strobe period (at the time of detecting the A-level to C-level data). Therefore, the bit lines BL corresponding to the A-level to C-level cells are charged. In this way, the locked-out bit lines BL in the verify operation (a verify-read operation) may greatly differ from those in the data read operation.

As described above, the locked-out bit lines BL are fixed to the voltage of the cell source line CELSRC or to the ground voltage and not charged. As a result, an adjacent interference effect is generated between the locked-out bit lines BL and non-locked-out bit lines BL. For example, when one locked-out bit line BL is adjacent to a non-locked-out bit line BL, the voltage of the non-locked-out bit line BL is influenced by capacitive coupling between the locked-out bit line BL and the non-locked-out bit line BL. Such an adjacent interference effect is increasingly conspicuous in proportion to memory downscaling.

Therefore, when the locked-out bit lines BL in the verify-read operation differ from those in the data read operation, the adjacent interference effect in the verify-read operation also differs from that in the data read operation. As a result, even if the memory cells MC pass the verification in the verify-read operation in the write operation, the sense amplifiers SA possibly erroneously detect the data in the actual data read operation. This is also called "read noise".

The read operation described above is a part of reading the UPPER page data, and the E-level data is discriminated from the A-level to C-level data in the read operation. Furthermore, it suffices to discriminate the E-level and A-level data from the B-level and C-level data (to read the UPPER page data) using the reference voltage VB according to the two-strobe method. In this case, it suffices that the sense amplifiers SA lock out the bit lines BL corresponding to the E-level and A-level cells and detect the B-level and C-level data during the second strobe period. Moreover, it suffices that the sense amplifiers SA discriminate the C-level data from the E-level to B-level data (to read the remaining UPPER page data) using the reference voltage VC according to either the two-strobe method or a one-strobe method. In a case of using the two-strobe method, it suffices that the sense amplifiers SA lock out the bit lines BL corresponding to the E-level to B-level cells and detect the C-level data during the second strobe period.

Figure 5A:
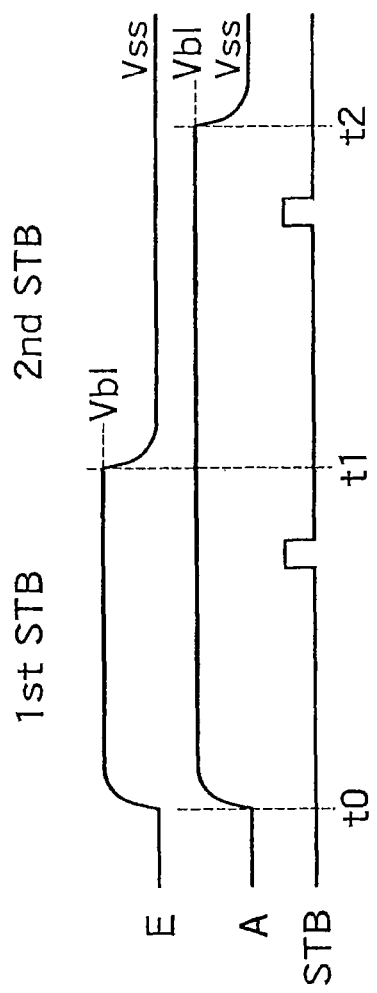
FIG. 5A is a timing chart showing the voltages of the bit lines BL in the read operation performed by the memory according to the present embodiment.
Figure 5B:
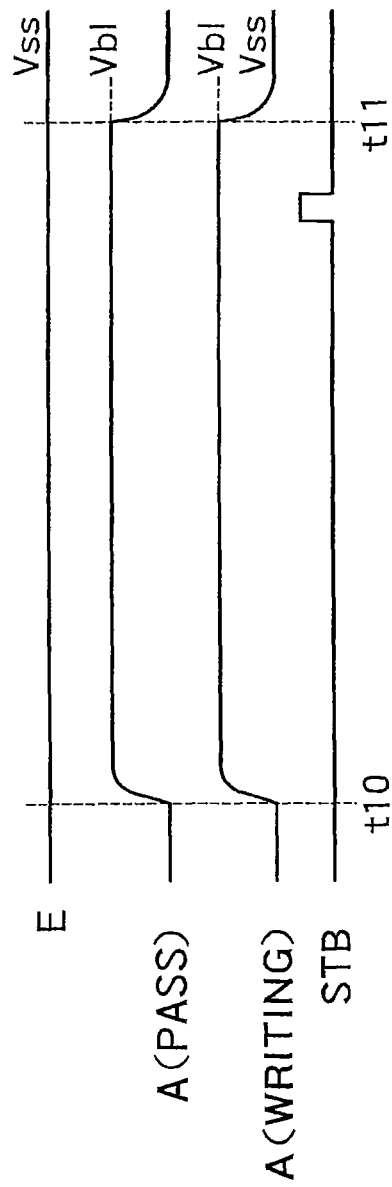
FIG. 5B is a timing chart showing the voltages of the bit lines BL in the verify-read operation in the write operation performed by the memory according to the present embodiment.

FIG. 5A is a timing chart showing the voltages of the bit lines BL in the read operation performed by the memory according to the present embodiment. FIG. 5B is a timing chart showing the voltages of the bit lines BL in the verify-read operation in the write operation performed by the memory according to the present embodiment. For the sake of convenience, the sense amplifiers SA detect the E-level and A-level data in both the read operation and the verify operation.

(Data Read Operation)

In the data read operation shown in FIG. 5A, the memory according to the present embodiment adopts the two-strobe method. During a period from a time t0 to a time t1, a first strobe operation is performed, and during a period from the time t1 to a time t2, a second strobe operation is performed.

In the first strobe operation (1st STB), the data in none of the columns is confirmed. Therefore, the sense amplifiers SA charge the bit lines BL in all the columns with Vbl (Vbl<Vss) at the time of data detection. At this time, the voltages of the word lines WL are equal to VA shown in FIG. 3. Therefore, the E-level cells are turned on and the corresponding bit lines BL are discharged. On the other hand, the A-level to C-level cells are kept to be turned off and the corresponding bit lines BL are not discharged. The sense amplifiers SA can discriminate the E-level cells to some extent by detecting the voltage of the bit lines BL. In the first strobe operation, it suffices that the sense amplifiers SA discriminate the columns of the E-level cells to some extent so as to prevent the voltage of the cell source line CELSRC from floating in the second strobe operation (2nd STB). Therefore, the first strobe period (t0 to t1) suffices to be short.

In the second strobe operation (2nd STB), the bit lines BL in the columns in which the memory cells MC are confirmed as the E-level cells are locked out and the voltages of the bit lines BL are fixed to Vss. Therefore, the sense amplifiers SA do not charge the bit lines BL in those columns. On the other hand, the sense amplifiers SA charge the other bit lines BL and execute the data detection. At this time, the voltages of the word lines WL are set to VA. The E-level cells MC that are not detected in the first strobe operation are turned on and the corresponding bit lines BL are discharged. On the other hand, the A-level cells MC are kept to be turned off and the corresponding bit lines BL are not discharged.

In the second strobe operation, the bit lines BL in the columns in which the memory cells MC are confirmed as the E-level cells are locked out and fixed to Vss. For this reason, although the E-level cells are turned on, the cell current Icell is not applied to the E-level cells. Therefore, the sense amplifiers SA can accurately detect the A-level data while suppressing the voltage of the cell source line CELSRC from rising. In this way, the adoption of the two-strobe method enables the sense amplifiers SA to accurately detect the E-level data and the A-level data.

(Verify Operation in Write Operation)

In the write operation, the columns of the memory cells MC to which the E-level data is to be written (hereinafter, also "E-write target cells") are confirmed in advance. Furthermore, before the write operation, a write target page, a write target block BLK, a write target bank, and the write target cell array 1 are in erasure states (at the E level). Therefore, there is no need to charge the bit lines BL corresponding to the E-write target cells (no need to write data to the E-write target cells). Therefore, as shown in FIG. 5B, in the memory according to the present embodiment, a similar operation to the second strobe operation (2nd STB) in the verify operation is performed in each write loop. That is, the bit lines BL corresponding to the E-write target cells are locked out and fixed to Vss, and the sense amplifiers SA do not charge the bit lines BL corresponding to the E-write target cells. The E-write target cells become the E-level cells as they are.

On the other hand, the sense amplifiers SA charge the bit lines BL corresponding to the memory cells MC to which the A-level data is to be written (hereinafter, also "A-write target cells") and execute the data detection. At this time, the sense amplifiers SA charge the bit lines BL in the columns other than the columns of the E-level cells without discriminating data-written memory cells MC from data-unwritten memory cells MC. For example, in the verify operation in a certain write loop, the bit lines BL corresponding to the A-write target cells are charged irrespectively of whether the bit lines BL pass the verification in the previous write loops.

When the voltages of the word lines WL are VA, data-unwritten A-write target cells are turned on, and the corresponding bit lines BL are discharged. On the other hand, when the A-write target cells become data-written A-level cells, the A-level cells are kept to be turned off. Therefore, the corresponding bit lines BL are not discharged. The sense amplifiers SA can thereby discriminate whether the A-level data is written to the memory cells MC in desired columns.

In an initial write loop of the write sequence, data is not written yet to the memory cells MC in most of the columns. Therefore, the sense amplifiers SA charge the bit lines BL corresponding to the A-write target cells other than the E-level cells in the verify operation. As the write sequence proceeds, the number of data-written memory cells MC increases. That is, the number of memory cells MC that pass the verification increases. As shown in FIG. 5B, in the memory according to the present embodiment, the bit lines BL in the columns of the data-written memory cells MC are charged even if the number of data-written memory cells MC increases. That is, the similar operation to the second strobe operation (2nd STB) in the read operation is performed in the verify operation irrespectively of the progress state of the write operation. Therefore, also in the verify operation in the final write loop of the write sequence, the columns of the charged bit lines BL are almost identical to those of the charged bit lines BL in the second strobe operation (2nd STB) in the read operation. It is thereby possible to make the adjacent interference effect of the bit lines BL in the verify operation almost identical to that of the bit lines BL in the read operation.

If the bit lines BL corresponding to the memory cells MC that pass the verification are locked out in each write loop, the bit lines BL in the columns of the data-written memory cells MC are not charged in the verify operation. In the final write loop of the write sequence, there are many uncharged bit lines BL because the data is already written to the memory cells MC in many columns. In this case, the adjacent interference effect in the verify operation in the final write loop greatly differs from that in the second strobe operation (2nd STB) in the read operation. Accordingly, the read noise is generated as described above.

In contrast, according to the present embodiment, in the verify operation, the bit lines BL in the columns of the A to C-write target cells other than the E-level cells are charged similarly to the second strobe operation (2nd STB) in the read operation irrespectively of the progress state of the write operation. The read noise can be thereby suppressed.

According to the present embodiment, even in the verify operation, the bit lines BL corresponding to the E-level cells are locked out. Accordingly, the sense amplifiers SA can detect the A-level to C-level data without raising the voltage of the cell source line CELSRC.

The memory cells MC that pass the verification are turned off in the verify operation in the subsequent write loops. Therefore, while it is necessary to charge (precharge) the bit lines BL in the columns of the data-written memory cells MC, no cell current Icell is applied to the memory cells MC. Accordingly, the cell current Icell does not increase so much.

FIG. 6 is a data table showing whether it is necessary or unnecessary to write data (whether data is permitted to be written or protected from being written). This data table is stored in a latch circuit (not shown) in each sense amplifier SA or the page buffer 3. For example, "1" indicates write protection and "0" indicates write permission.

Input data Din is write data input from outside, and the write loop is executed using the input data Din at the beginning of the write sequence. As for the columns of the memory cells MC completed with data writing in the write sequence, it is unnecessary to perform the program operation to the memory cells MC in the subsequent write loops. Therefore, in program data, columns (A (PASS)) of the memory cells MC that pass the verification are write protected (1).

However, when the program data is used in the verify operation, the bit lines BL corresponding to the memory cells MC that pass the verification are locked out in each write loop. Considering this, in the present embodiment, the input data Din is used as it is in the verify operation. That is, in the program operation in each write loop, the sense amplifiers SA drive the bit lines BL according to the program data. On the other hand, in the verify operation in each write loop, the sense amplifiers SA drive the bit lines BL according to the input data Din. With this configuration, the memory according to the present embodiment can perform the verify operation described with reference to FIG. 5B.

Figure 7:
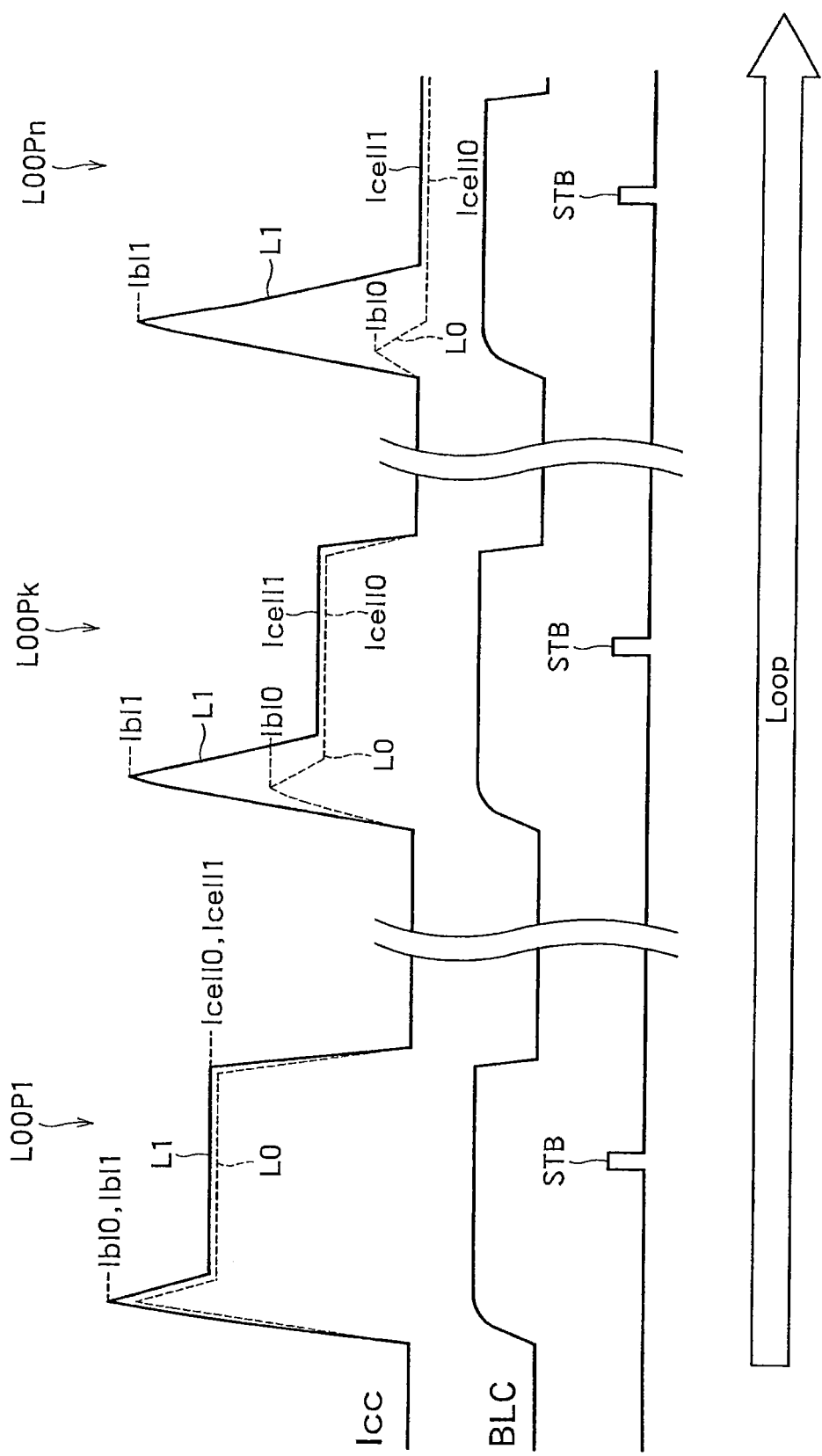
FIG. 7 is a timing chart showing a consumed current Icc, a bit line voltage BLC, and a strobe signal STB in the verify operation in each write loop of a certain write sequence.

FIG. 7 is a timing chart showing a consumed current Icc, a bit line voltage BLC, and a strobe signal STB in the verify operation in each write loop of a certain write sequence. The consumed current Icc is a current consumed in the memory. The write sequence includes write loops LOOP1 to LOOPk to LOOPn (where n is an integer and 0≤K≤n). In the verify operation, the consumed current Icc mainly includes a charging current (Ibl0 or Ibl1) for the bit lines BL and a cell current (Icell0 or Icell1) applied to the memory cells MC. The program operation in each write loop is omitted from FIG. 7.

A broken line L0 indicates the consumed current (cell current) Icc in the verify operation performed by a memory that includes the PCHSEL function and that locks out data-written columns. A solid line L1 indicates the consumed current (cell current) Icc in the verify operation performed by the memory according to the present embodiment.

With reference to the solid line L1, in the memory according to the present embodiment, the bit lines BL corresponding to the A to C-write target cells other than the E-level cells are charged irrespectively of whether the memory cells MC pass the verification even if the write loops proceed from LOOP1 to LOOPk and then to LOOPn. Therefore, peaks of the charging current Ibl1 for the bit lines BL in the write loops LOOP1 to LOOPn are almost identical. For example, variations in the peak of the charging current Ibl1 for the bit lines BL are within a range of about 10% in the write loops LOOP1 to LOOPn.

On the other hand, when the A to C-write target cells pass the verification and become the A-level to C-level cells, the threshold voltages Vt of the A-level to C-level cells exceed the verify levels VA to VC, respectively. Therefore, in the verify operation in the subsequent write loops, the data-written A-level to C-level cells are turned off. Accordingly, when the write loops proceed from LOOP1 to LOOPk and then to LOOPn and the number of memory cells MC that pass the verification increases, the cell current Icell1 gradually lowers.

On the other hand, in the memory corresponding to the broken line L0, the bit lines BL corresponding to the E-level cells are locked out and the bit lines BL in the columns of the memory cells that pass the verification are also locked out by the PCHSEL function. Therefore, when the write loops proceed from LOOP1 to LOOPk and then to LOOPn and the number of data-written A-level to C-level cells increases, the peaks of the charging current Ibl0 for the bit lines BL as well as the cell current Icell0 gradually decreases.

The peaks of the charging currents Ibl0 and Ibl1 appear between the rising of the bit line voltage BLC and the strobe signal STB either almost simultaneously with or right after the rising of the bit line voltage BLC. It can be rephrased that the peaks of the charging currents Ibl0 and Ibl1 occur either simultaneously with or right after the rising of the consumed current Icc.

In this way, it is possible to determine whether a memory of interest is the memory according to the present embodiment by measuring the consumed current (cell current) Icc and checking the peaks thereof (the peaks of the charging current (Ibl0 or Ibl1) for the bit lines BL).

Figure 8:
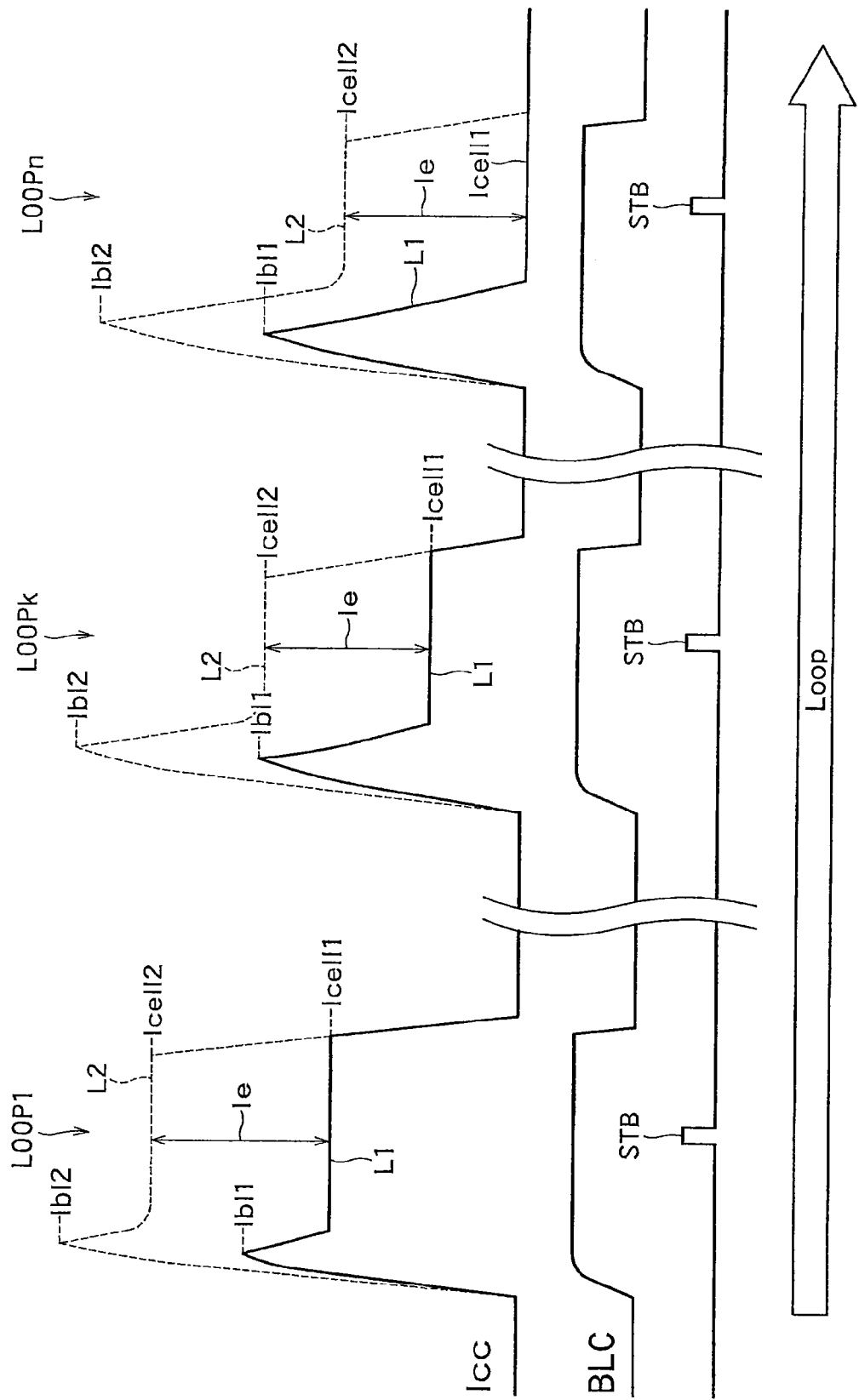
FIG. 8 is a timing chart showing the consumed current Icc and the bit line voltage BLC in the verify operation in each write loop of a certain write sequence.

FIG. 8 is a timing chart showing the consumed current Icc and the bit line voltage BLC in the verify operation in each write loop of a certain write sequence. In the verify operation, the consumed current Icc mainly includes the charging current (Ibl0 or Ibl2) for the bit lines BL and the cell current (Icell0 or Icell2) applied to the memory cells MC.

A broken line L2 indicates the consumed current Icc in the verify operation performed by a memory that does not include the PCHSEL function. Similarly to the solid line L1 shown in FIG. 7, the solid line L1 indicates the consumed current Icc in the verify operation performed by the memory according to the present embodiment.

As described above, in the memory according to the present embodiment, the peaks of the charging current Ibl1 for the bit lines BL in the write loops LOOP1 to LOOPn are almost identical (within the range of 10%, for example). Furthermore, when the write loops proceed from LOOP1 to LOOPk and then to LOOPn and the number of memory cells MC that pass the verification increases, the cell current ken gradually lowers.

On the other hand, in the memory corresponding to the broken line L2, the bit lines BL corresponding to the E to A-write target cells are charged because of lack of the PCHSEL function. Therefore, when the write loops proceed from LOOP1 to LOOPk and then to LOOPn and the number of data-written A-level to C-level cells increases, the cell current Icell2 gradually lowers while peaks of the charging current Ibl2 for the bit lines BL are kept high. It can be considered that a difference between the charging currents Ibl1 and Ibl2 is a current (electric charges) for charging the bit lines BL corresponding to the E-level cells.

The solid line L1 (the consumed current Icc of the memory according to the present embodiment) shown in FIGS. 7 and 8 has the conspicuous peaks of the charging current Ibl1 in a case of writing the A-level to C-level data to all the write target cells. That is, in the present embodiment, when the E-level cells are not included in the write target cells, no bit lines BL are locked out. Accordingly, in the verify operation in each of the write loops LOOP1 to LOOPn, the bit lines BL in all the columns are charged (precharged). As a result, the peaks of the charging current Ibl1 become quite high. That is, the peaks of the charging current Ibl1 in the verify operation vary depending on the write data. In this case, when the number of E-level write-target data decreases, the peaks of the charging current Ibl1 rise. Furthermore, when the writing proceeds, the cell current Icell1 lowers. Accordingly, in the final write loop LOOPn, the peak of the charging current Ibl1 becomes more conspicuous.

Figure 9:
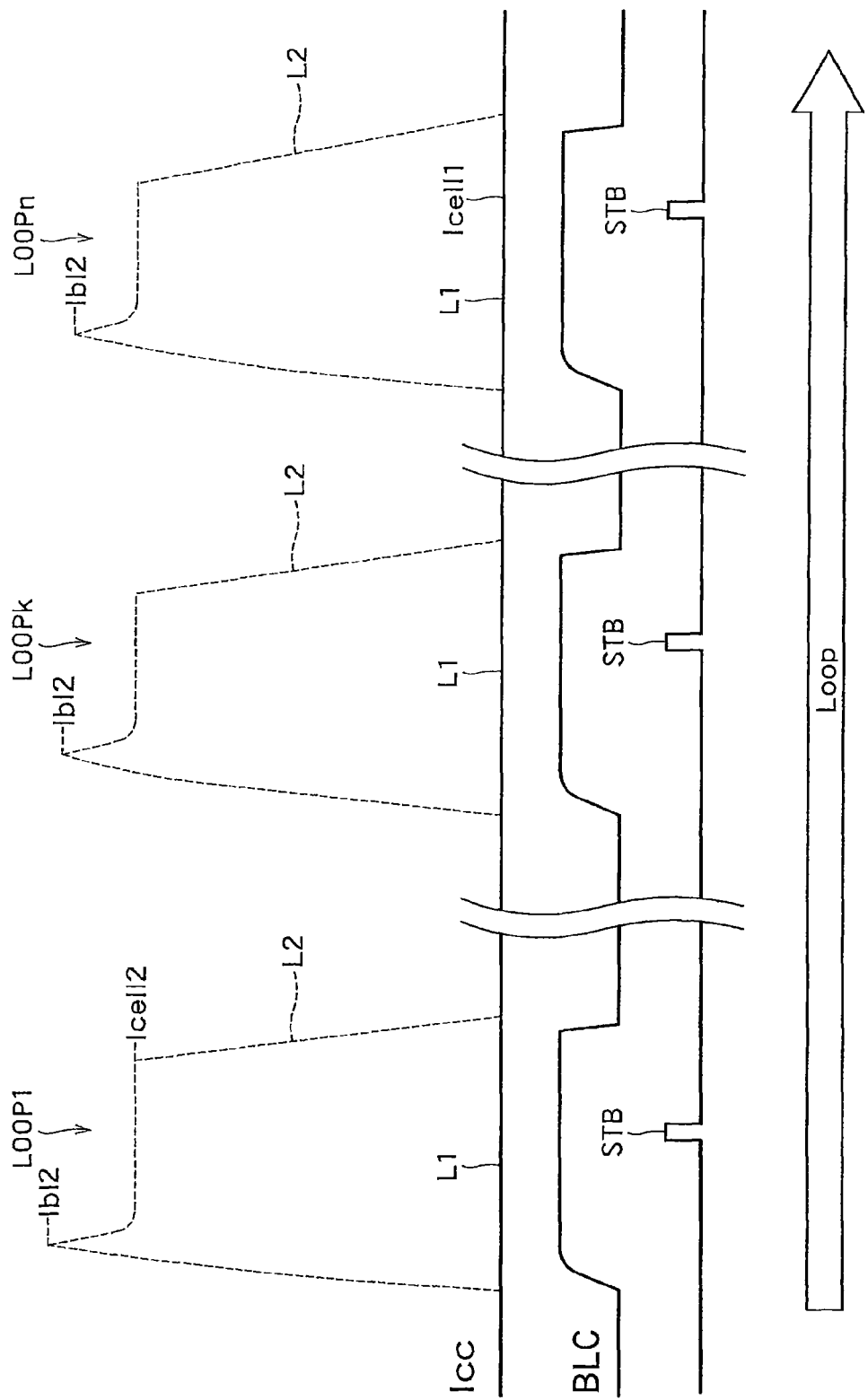
FIG. 9 is a timing chart showing the consumed current Icc and the bit line voltage BLC in the verify operation when the write data is all the E-level data.

FIG. 9 is a timing chart showing the consumed current Icc and the bit line voltage BLC in the verify operation when the write data is all the E-level data. The broken line L2 indicates the consumed current Icc in the verify operation performed by the memory that does not include the PCHSEL function. The solid line L1 indicates the consumed current Icc in the verify operation performed by the memory according to the present embodiment.

As indicated by the solid line L1, when the write data is all the E-level data, the consumed current Icc in the verify operation according to the present embodiment does not have any peak of the charging current Ibl1 and is almost constant (almost zero). This is because the PCHSEL function enables the bit lines BL in the columns of the E-write target cells to be locked out. Therefore, when the write data is all the E-level data, the bit lines BL in all the write-target columns are locked out. As a result, almost no consumed current Icc flows. That is, in this case, the consumed current Icc has no peak that appears either almost simultaneously with or right after the rising of the bit line voltage BLC. Furthermore, in each of the write loops LOOP0 to LOOPn, the consumed current Icc is almost identical and hardly changed. Operations performed by circuits other than the memory cell array 1 sometimes consume the current. In this case, the consumed current Icc is shifted to a predetermined value almost constantly.

On the other hand, in the memory that does not include the PCHSEL function, the consumed current Icc has peaks that appear either almost simultaneously with or right after the rising of the bit line voltage BLC, as indicated by the broken line L2. Moreover, in this case, the consumed current Icc remains high in each of the write loops LOOP0 to LOOPn because the cell current Icell2 is applied to the E-write target cells.

In this way, the memory according to the present embodiment greatly differs from the memory that does not include the PCHSEL function in the consumed current Icc. Therefore, it is possible to determine whether a memory of interest is the memory according to the present embodiment by measuring the consumed current (cell current) Icc and checking the peaks thereof (the peaks of the charging current (Ibl1 or Ibl2) for the bit lines BL). If no peak appears in the consumed current Icc, a maximum value of the Icc may be used to determine whether a memory of interest is the memory according to the present embodiment.

In above embodiments, the words of "connect" include "electrically connect", not only "physically connect" or "directly connect".

While an MLC (Multiple Level Cell) that stores therein data of a plurality of bits has been described in the present embodiment, the present embodiment is also applicable to an SLC (Single Level Cell) that stores therein one-bit data.

A memory cell array formation may be disclosed in U.S. patent application Ser. No. 12/407,403 filed on Mar. 19, 2009. U.S. patent application Ser. No. 12/407,403, the entire contents of which are incorporated by reference herein.

Furthermore, a memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore, a memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore, a memory cell array formation may be disclosed in U.S. patent application Ser. No. 12/532,030 filed on Mar. 23, 2009. U.S. patent application Ser. No. 12/532,030, the entire contents of which are incorporated by reference herein.

In the embodiments, the page unit is the range of a plurality of memory cells MC along one word line WL and the erasure unit is the range of a plurality of NAND cell units 4 arranged in the direction of the word line WL. However, the definitions of the page unit and the erasure unit are not limited to those described above. For example, when one block BLK includes a plurality of sub-blocks and a plurality of so-called "strings" constitute each of the sub-blocks, a plurality of memory cells MC included in a certain sub-block among the memory cells MC connected commonly to one word line WL can be defined as one page and the sub-block can be defined as the erasure unit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of memory cells;
a plurality of word lines connected to the memory cells;
a plurality of bit lines connected to the memory cells; and
a sense amplifier unit connected to the bit lines, wherein
a data write operation comprises a first write loop and a second write loop, the first write loop including a first program operation and a first verify operation, the second write loop including a second program operation and a second verify operation, and
a maximum value of a consumed current in the first verify operation is substantially equal to a maximum value of the consumed current in the second verify operation, and the consumed current in the first verify operation is substantially same as the consumed current in the second verify operation if data input in the data write operation is all equal to first data corresponding to an erasure state, wherein
the maximum value of the consumed current appears between a first point in which a voltage of the bit lines starts rising and a second point in which a strobe signal starts rising.

2. The device of claim 1, wherein the maximum value of the consumed current appears either substantially simultaneously with or right after rising of a voltage of the bit lines.

3. The device of claim 1, wherein a maximum of the consumed current is identical to a maximum of a charging current for the bit lines.

4. The device of claim 1, wherein the consumed current in the first verify operation is substantially equal to the consumed current in the second verify operation if data input in the data write operation is all equal to first data.

5. The device of claim 1, wherein the consumed current is substantially constant in the verify operation in a certain one of the write loops if data input in the data write operation is all equal to first data.

6. The device of claim 4, wherein the consumed current is substantially constant in the verify operation in a certain one of the write loops if data input in the data write operation is all equal to first data.

7. The device of claim 1, wherein the consumed current in the verify operation in a case where write data is all the first data has no maximum that appears either substantially simultaneously with or right after rising of a voltage of the bit lines.

8. The device of claim 1, wherein a maximum of the consumed current in the first verify operation or the second verify operation changes depending on write data.

* * * * *